United States Patent [19]

Suzki et al.

[11] 4,251,129
[45] Feb. 17, 1981

[54] PHOTOELECTRIC DETECTING DEVICE

[75] Inventors: Akiyoshi Suzki, Tokyo; Ichiro Kano, Yokohama, both of Japan

[73] Assignee: Canon Kabushiki Kaisha, Tokyo, Japan

[21] Appl. No.: 948,776

[22] Filed: Oct. 5, 1978

[30] Foreign Application Priority Data

Oct. 5, 1977 [JP] Japan .............................. 52-119699
Oct. 6, 1977 [JP] Japan .............................. 52-120419

[51] Int. Cl.³ ............................................. G02B 21/06
[52] U.S. Cl. .................................. 350/91; 356/401; 350/6.8; 350/370; 350/401
[58] Field of Search ................... 350/91, 6.9, 6.1, 6.7, 350/6.4, 99, 276 SL, 281, 285, 236, 237, 162 SF, 154; 356/120, 172, 71, 209, 400, 401; 358/199

[56] References Cited

U.S. PATENT DOCUMENTS

| | | | |
|---|---|---|---|
| 3,751,170 | 8/1973 | Hidaka | 356/401 |
| 3,796,497 | 3/1974 | Mathisen et al. | 356/152 |
| 3,943,359 | 3/1976 | Matsumoto et al. | 356/401 |
| 4,044,363 | 8/1977 | Morgan | 350/6.91 |
| 4,062,623 | 12/1977 | Suzuki et al. | 356/401 |
| 4,070,117 | 1/1978 | Johannsmeir et al. | 356/400 |
| 4,110,004 | 8/1978 | Bocker | 350/154 |

Primary Examiner—John K. Corbin
Attorney, Agent, or Firm—Fitzpatrick, Cella, Harper & Scinto

[57] ABSTRACT

A photoelectric detecting device in which a photoelectric detecting system for scanning a surface to be inspected by a light beam and for receiving the light from the inspected surface by a photoelectric detector is partly common to an observation optical system for illuminating the inspected surface with an illuminating light and for observing the inspected surface. The device has a dichroic mirror and a polarizing beam splitter, whereby photoelectric detection is effected without loss of light and without adverse effect of the illuminating light.

2 Claims, 7 Drawing Figures

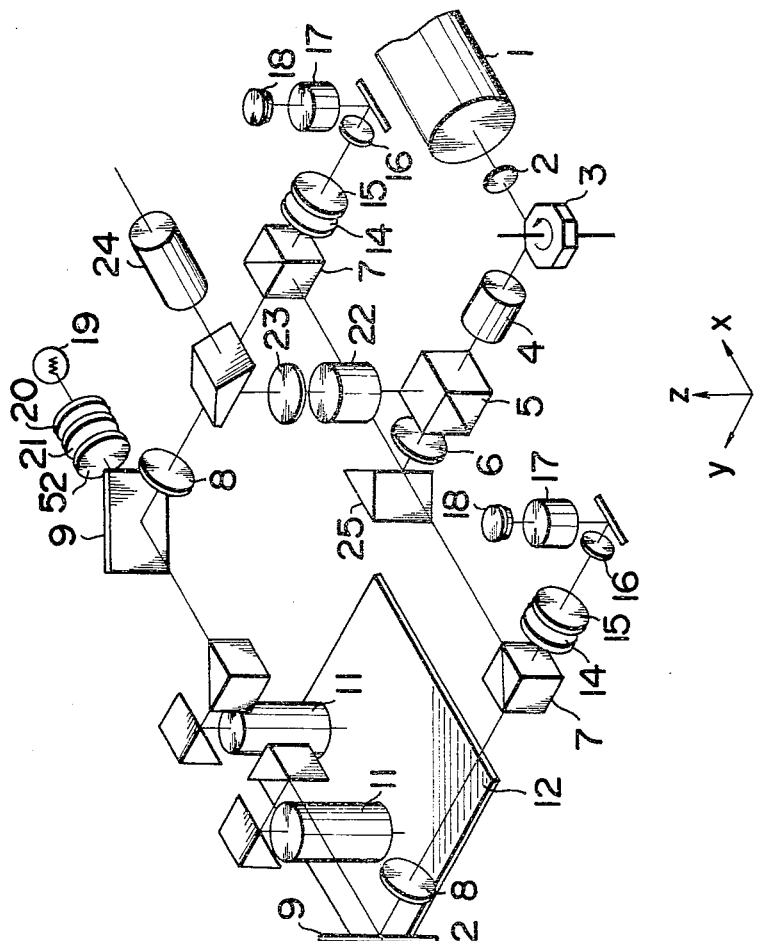
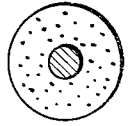
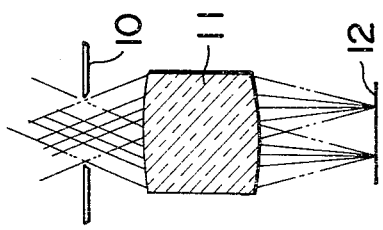

PHOTOELECTRIC DETECTING DEVICE

BACKGROUND OF THE INVENTION

1. Field of the Invention

This invention relates to a photoelectric detecting device, and more particularly to a photoelectric detecting device in which a portion of a photoelectric detecting system for scanning a surface to be inspected by a light beam and for receiving the light from the inspected surface by a photoelectric detector, the photoelectric detection being effected in the view-field of the pupil, is common to a part of an observation optical system for illuminating the inspected surface with an illuminating light and observing the inspected surface.

2. Description of the Prior Art

A photoelectric detecting device in which a portion of a photoelectric detecting system for scanning a surface to be inspected by a light beam and for receiving the light from the inspected surface by a photoelectric detector is common to a part of an observation optical system for illuminating the inspected surface with an illuminating light and observing the inspected surface has already been proposed by our U.S. Application Ser. No. 870,081 now U.S. Pat. No. 4,165,149 filed on Jan. 17, 1978 (German Patent Application No. P 2802286.8 filed on Jan. 19, 1978). This invention relates to a improvements in such a device. The improvement resides in that photoelectric detection is effected without loss of light.

SUMMARY OF THE INVENTION

It is an object of the present invention to provide a photoelectric detecting device in which photoelectric detection is effected without loss of light.

To achieve such an object, the photoelectric detecting device of the present invention comprises a scanning optical system for scanning a surface to be scanned by a light spot, said scanning optical system including a first light source means of a certain wavelength of rectilinearly polarized light, an observation optical system for illuminating said scanned surface with an illuminating light source to observe said scanned surface, said observation optical system including a second light source means of a wavelength different from said wavelength of rectilinearly polarized light, at least a portion of said observation optical system being common to a portion of said scanning optical system, a wavelength selecting beam splitter disposed in said common portion for directing light to said observation optical system, a polarizing beam splitter disposed in said common portion for directing light to a photoelectric element, and means for varying the polarized state of the light from said light spot directed toward said polarizing beam splitter.

The first light source means may be a laser.

The invention will become more fully apparent from the following detailed description thereof taken in conjunction with the accompanying drawings.

BRIEF DESCRIPTION OF THE DRAWINGS

FIG. 2 illustrates the principle of the objective lens used with the present invention.

FIG. 3 is a perspective view showing the optical system of FIG. 1.

DESCRIPTION OF THE PREFERRED EMBODIMENTS

Figure 1:
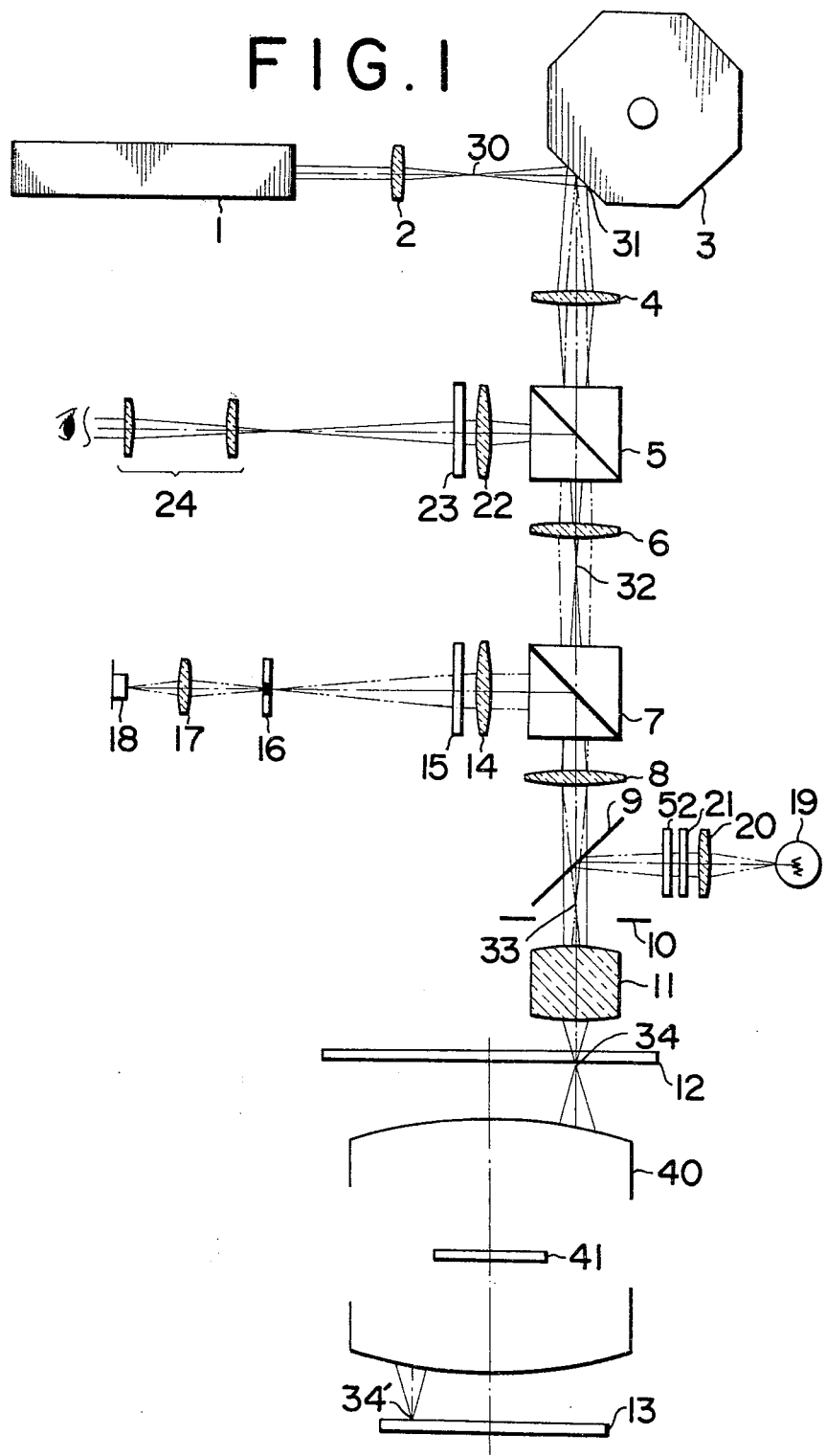
FIG. 1 shows the optical arrangement of the photoelectric detecting device according to the present invention.

FIG. 1 shows the optical arrangement of the photoelectric detector device according to the present invention. Designated by 1 is an He-Ne gas laser. The direction of polarization of the light from the laser 1 lies in the plane of the drawing sheet. Such light is referred to as the P polarized light. FIG. 1 further includes a condenser lens 2, a rotatable polygon mirror 3, a relay lens 4, and a dichroic mirror 5 for directing light to an observation optical system 23, 24. The dichroic mirror 5 transmits therethrough the light from the laser 1. FIG. 1 further includes a field lens 6, and a polarizing splitter 7 for directing light to a photoelectric detecting system 14, 15, 16, 17, 18. The splitter 7 transmits therethrough the P polarized light. FIG. 1 also includes a relay lens 8, a beam splitter 9 for directing the light from an observation illuminating optical system 19, 20, 21, 50, an objective lens 11 having a pupil 10, a mask 12, a wafer 13, a ½ lens 40 for forming the image of the mask 12 on the wafer, and a ¼ plate 41. These members together constitute an optical system for laser beam scanning.

In the scanning optical system of FIG. 1, the relation of the formed image of the scanning spot is as follows: In FIG. 1, 34 and 34' are places scanned, and if the light path is traced back from 34' toward the rotatable polygon mirror 3, the spot 34' is once focused at a position 32 near the field lens 6 through an equal magnification focusing lens 40, the objective lens 11 and the relay lens 8, and again focused at a position 30 after being reflected by the rotatable mirror through the relay lens 4. Thus, the positions 30, 32, 34 and 34' are in conjugate relationship with one another. Therefore, if the diameter of the laser spot to the position 30 is $\phi$ and the focusing magnification from the position 30 to the position 34' is $\beta$, the diameter of the scanning spot at the positions 34 and 34' is represented by $\beta\phi$.

The focusing relationship of the pupil of the optical system of FIG. 1 is as important as the conjugate relationship of the scanning beam on the surface of the actual object as described above. The pupil of the objective lens is indicated at 10 in the Figure, and a point 33 on the optic axis which is the central point of the pupil 10 and the reflecting point 31 on the rotatable polygon mirror 3 is conjugate with each other. Thus, if viewed from the view point of the entry of the laser beam into the objective lens 11, the arrangement of FIG. 1 may be said to be equivalent to a case where the rotatable polygon mirror 3 is placed at the position of the pupil 10.

To understand the optical system of FIG. 1, one must understand the action of the objective lens 11. FIG. 2 shows the principle of the action of the objective lens used with the present invention. According to the present invention, the objective lens 11 is telecentrically disposed. A telecentric objective lens refers to a lens in which the position 10 of the pupil which is the place determining the size of the light beam passed through the objective lens is coincident with the focal plane. The light ray passed through the center of the pupil 10 provides the central ray of the light beam and so, it is called the principal ray. Since the center of the pupil is the focus of the objective lens, the central ray becomes parallel to the optic axis of the objective lens after passing through the objective lens, and enters the surface 12 of the object perpendicularly thereto. When impinging on the portion of the object which effects mirror reflection, the light ray having entered perpendicularly follows the same path as previously, and passes through the objective lens to come back to the central position of the pupil. On the other hand, if the portion on which the light impinges has a pattern thereon, the light is scattered at the portion of the borderline forming the pattern. If the portion of the borderline is generically referred to as the edge, the light scattered by the edge does not follow the same light path as previously, unlike the mirror surface reflection. Therefore, when passing through the pupil by being again caught by the objective lens, the scattered light no longer passes through the center of the pupil. This shows that when the reflected light passed through the objective lens is observed on the pupil, the component reflected by the mirror surface and the scattered light component are spatially separated from each other in the pupil. FIG. 2 illustrates the manner of such separation. The mirror surface reflected component entering the pupil and passing through the objective lens and again passing through the pupil is indicated by hatching in FIG. 2, and the scattered light which can be caught by the objective lens is indicated by dots. The diameter of the light beam effective for the mirror surface reflecting portion is normally selected to a sufficiently small value with respect to the diameter of the pupil to enable the scattered light to be effectively caught, and the diameter ratio may desirably be within the range in the vicinity of 0.1 to 0.7.

Turn back to FIG. 1 to consider the photoelectric detecting optical system leading from the polarization splitter 7 to a photodetector 18. Denoted by 14 is a lens for imaging the pupil 10 of the objective lens 11, and 15 a filter for passing therethrough the light for photoelectric detection and for substantially intercepting the other wavelengths, for example, the light of the wavelength range used with a visually observing optical system. The position 16 is the place whereat the image of the pupil 10 is formed for the lens 14 for imaging the pupil. Here is disposed a douser 16 for passing therethrough only the scattered light and for blocking the non-scattered light. The scattered light passed through the douser 16 is collected onto the photodetector 18 by a condenser lens 17. Therefore, the pupil 10, the douser 16 and the photodetector 18 are in conjugate relationship with one another. The douser may be easily prepared as by patterning a transparent glass substrate by the use of metal or Chinese ink. Accordingly, the photodetector system for detecting the scattered light puts out an output only when the scanning spot comes to the edge portion of the pattern. Assuming that the pattern is the alignment marks indicated on the mask and the wafer, respectively, the deviation of the relative position of the mask and the wafer can be detected from the output signal. The relation between the two may be corrected by an unshown driving system in accordance with the detected amount of deviation, thereby effecting auto-alignment.

FIG. 1 further includes an illuminating system 19, 20, 21, 52 and an observation system 22, 23, 24. In the illuminating system, reference numeral 19 designates a mercury lamp, and 20 a condenser lens for forming the image of a light source on the pupil 10 of the objective lens 11 and serving to effect the so-called Koehler illumination. Designated by 21 is a filter which passes therethrough the wavelength of non-sensitive range (1 line) of photoresist applied to the wafer. The filter 21 is sometimes required to minimize the transmittivity of light of the photoelectric detection wavelength so that any excess light does not reach the photodetecting system, but the filter 21 may be suitably selected in view of the filter 15. A polarizing plate 52 passes therethrough the S polarized light. In the observation system, reference numeral 22 denotes an erector for rotating the image in normal direction, 23 a filter for attenuating the photoelectrically detected light, and in the example of FIG. 1, the light from the scanning laser, and 24 an eyepiece.

Operation will now be described. The laser beam is reflected by the rotatable polygon mirror 3, and then enters the dichroic mirror 5. The dichroic mirror 5 has a sufficient transmittivity to the laser beam. Having passed through the dichroic mirror 5, the light travels to the polarizing beam splitter 7, which transmits therethrough the P polarized light. Therefore, the beam scans over the mask 12 through the objective lens 11. The beam further passes from the mask through the image forming optical system 40 and is reflected by the wafer 13 and again passes through the optical system 40 back to the objective lens, and the beam passes twice through the ¼ wavelength plate 41, so that the direction of polarization is rotated for 90° and the P polarized light becomes S polarized light. Therefore, the laser beam for photoelectric detection is reflected by the polarizing beam splitter 7 and directed to the system leading to the photoelectric detector 18. In the meantime, the factor for the attenuation of the laser beam can be almost eliminated. The regular reflected light of the spots 34, 34' is cut off by the filter 16 and does not reach the photoelectric element 18. Therefore, dark field-like photoelectric detection is carried out.

On the other hand, the observation optical system is as important as the photoelectric detecting system, because the observation optical system not only serves the observation of the pattern but also plays an important role in effecting necessary things such as incipient setting of the mask during the auto-alignment. The present invention is therefore featured in that the direction of polarization of the laser which is the light for photoelectric detection and the direction of polarization of the illuminating light for observation are othogonal to each other at a point of time whereat they are incident on the mask.

Causing the direction of polarization of the illuminating light for observation to be orthogonal to the laser means setting the polarizing plate 52 in the system of FIG. 1 such that the S polarized light passes therethrough. Of the light of the S polarization which has reached the mask 12, the reflected light on the mask surface which provides a flare light during observation to weaken the contrast of the entire system remains S polarized, it is reflected by the polarizing beam splitter 7 and goes to the photoelectric detecting system side. However, this light differs in wavelength from the laser beam and therefore is prevented from reaching the photoelectric detector 18 by the filter 15.

Of the illuminating light for observation, the light other than the light reflected by the mask surface reaches the wafer 13 and is thereby reflected back, but the S polarization has changed to the P polarization due to the action of the ¼ wavelength plate by that time. Thus, after having passed back through the objective lens, the light is P polarization so that it passes through the polarizing beam splitter 7 and enters the dichroic beam splitter 5. The observation light is here reflected and enters the observation optical system. Therefore, the characteristic of the dichroic beam splitter 5 lies in that it passes the laser beam therethrough and reflects the observation light.

FIG. 3 shows an embodiment in which the optical system of FIG. 1 is constructed three-dimensionally. The alignment of the mask and the wafer is effected usually by observing a plurality of places on the mask and wafer because the degree of two-dimensional freedom must all be secured.

The example of FIG. 3 is one in which two places are being observed and detected, and the function of splitting the scanning laser beam into two beams is performed by a roof-shaped mirror 25. The edge line of the mirror 25 is set so as to intersect the optic axis. On or near the edge line, the images of the mask and wafer are formed by the objective lens 11 and the relay lens 8. The edge line which provides the primary image plane of the mask and wafer serves as a split line of the view field when observed through an eyepiece. The reference numerals in FIG. 3 correspond to those in FIG. 1, but unnumbered parts represent mirrors or prisms used to bend the light path. In FIG. 1, the pupil 10 of the objective lens is shown as a diaphragm for convenience of illustration, but the effective diameter of the pupil 10 is necessarily determined as by the effective diameter of the objective lens and this eliminates the need to provide a mechanical diagram. Therefore, any special part is omitted at the position of the pupil 10.

In the foregoing description, the lens 40 for forming the image of the mask 12 on the wafer 13 has been explained as a both-side telecentric lens, and an example of a one-side telecentric lens will now be described. FIG. 4 shows the light path in the image forming optical system in which the wafer 12 side is telecentric and the mask 13 side is not telecentric. The image forming optical system 40 is provided by a lens or a mirror. The principal ray of the image forming light beam on the mask 12 side is inclined with respect to the optic axis because it is not telecentric, and the principal ray on the wafer 13 side is parallel to the optic axis because it is telecentric and thus enters the wafer perpendicularly thereto. Consider the case where a point 41 on the mask is observed by the use of the objective lens 11. The dotted lines in FIG. 4 indicate the light path in the image forming optical system when it is assumed that the scanning beam enters the mask perpendicularly thereto as in FIG. 1. As is apparent from FIG. 4, the light directly reflected by the mask returns to the objective lens 11 perpendicularly thereto, while the light reflected back at the conjugate point 42 on the wafer does no longer come back to the objective lens 11 perpendicularly thereto. The distribution of the direct light reflected by the mirror surface on the pupil and the scattered light is not so simple as shown in FIG. 2, but the distribution of the light from the mask and the distribution of the light from the wafer overlap each other while deviating from each other as shown in FIG. 2(b). Therefore, in order to enable the system shown in FIG. 1 to be applied intactly, the configuration of the stop 16 must be contrived, and the stop must be sufficiently great and configured to intercept the two direct lights existing in deviated relationship at the same time.

Figures 4A, 4B:
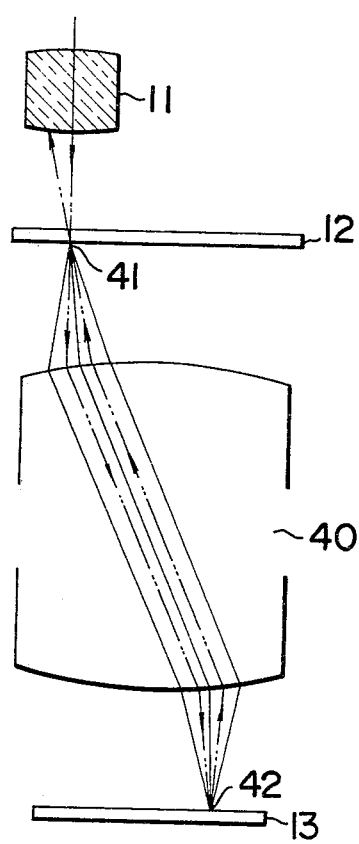
FIG. 4 shows the light path in the image forming optical system in the present invention.
Figure 5:
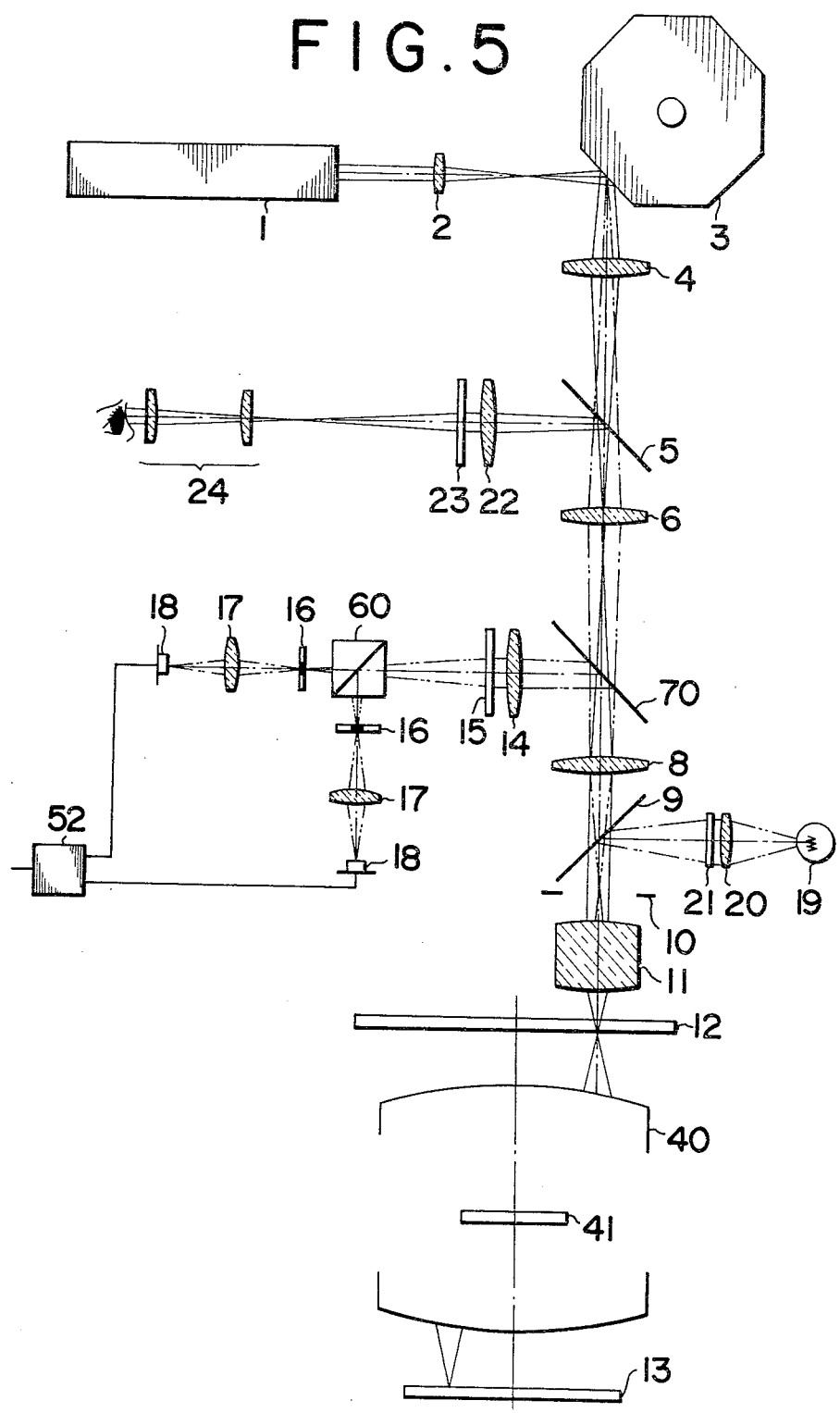
FIG. 5 shows another embodiment of the present invention.

FIG. 5 shows a second embodiment of the present invention. The system of FIG. 5 takes the form in which the system of FIG. 1 is intactly applied to the system of FIG. 4, but it differs from the system of FIG. 1 in that a polarizing beam splitter 60 is disposed in the photoelectric detecting system to split the channel into a plurality of channels and that the polarizing beam splitter 7 is replaced by an ordinary half-mirror 70. Of course, the image forming optical system is aberration-corrected with respect to the photoelectrically detected wavelength with the ¼ wavelength plate inserted.

Operation of the FIG. 5 system will now be described. To provide efficient photoelectric detection, it is assumed that the beam from laser 1 is rectilinearly polarized light and that it scans over the mask 12 and wafer 13 through the objective lens while remaining rectilinearly polarized light. The direction of polarization of the light directly reflected from the mask 12 and the direction of polarization of the light coming back from the wafer are made orthogonal to each other by the action of the ¼ wavelength plate 41, as already noted. To effect alignment of the mask and wafer, the position signals of the mask and wafer must be photoelectrically detected. The light directly reflected from the mask only has a signal about the mask pattern, while the light having reached the wafer has a wafer signal and the light information of the mask signal. Therefore, by catching the reflected light from the wafer, the positions of both the mask and the wafer may be detected. As described in connection with FIG. 4, where the image forming optical system is not telecentric with respect to either of the mask side or the wafer side, the reflected light from the mask and the reflected light from the wafer become different in angle, but the two lights are separated by the polarizing beam splitter 60. Thus, the distribution of the light observed on the image plane 16 of the pupil after having passed through the polarizing beam splitter is such as shown in FIG. 2(b) wherein the light is separated into non-scattered light and scattered light and avoids the state as shown in FIG. 4(b) wherein the lights overlap each other while deviating from each other. To enhance the efficiency with which the scattered light is taken out, it is desirable to make clear the boundary between the non-scattered light portion and the scattered light portion and reduce the area of the light intercepting portion, and light interception in the state as shown in FIG. 4(b) suffers a great loss. The polarizing beam splitter 60 again divides the two lights overlapping each other in the polarizingly separated form to thereby eliminate the overlap therebetween. The improvement in the scattered light taking-out efficiency resulting from the elimination of the overlap is pronounced. In the embodiment of FIG. 5, a douser for passing therethrough the scattered light is inserted for each of the separated lights for the purpose as described above and detection is effected by a photodetector. As regards the mask signals, the output is put out from both channels at the same time, and as regards the wafer signal, the output is put out from the channel on that side which the reflected light from the wafer reaches. Designated by 52 is an adder for adding together the outputs from two detectors.

To take out the signals of both the mask and the wafer, the information of the light reaching the wafer and reflected thereby is enough. Therefore, the light reflected from the wafer need not be separated and then electrically applied but necessary and sufficient information can be obtained by a simpler system.

Figure 6:
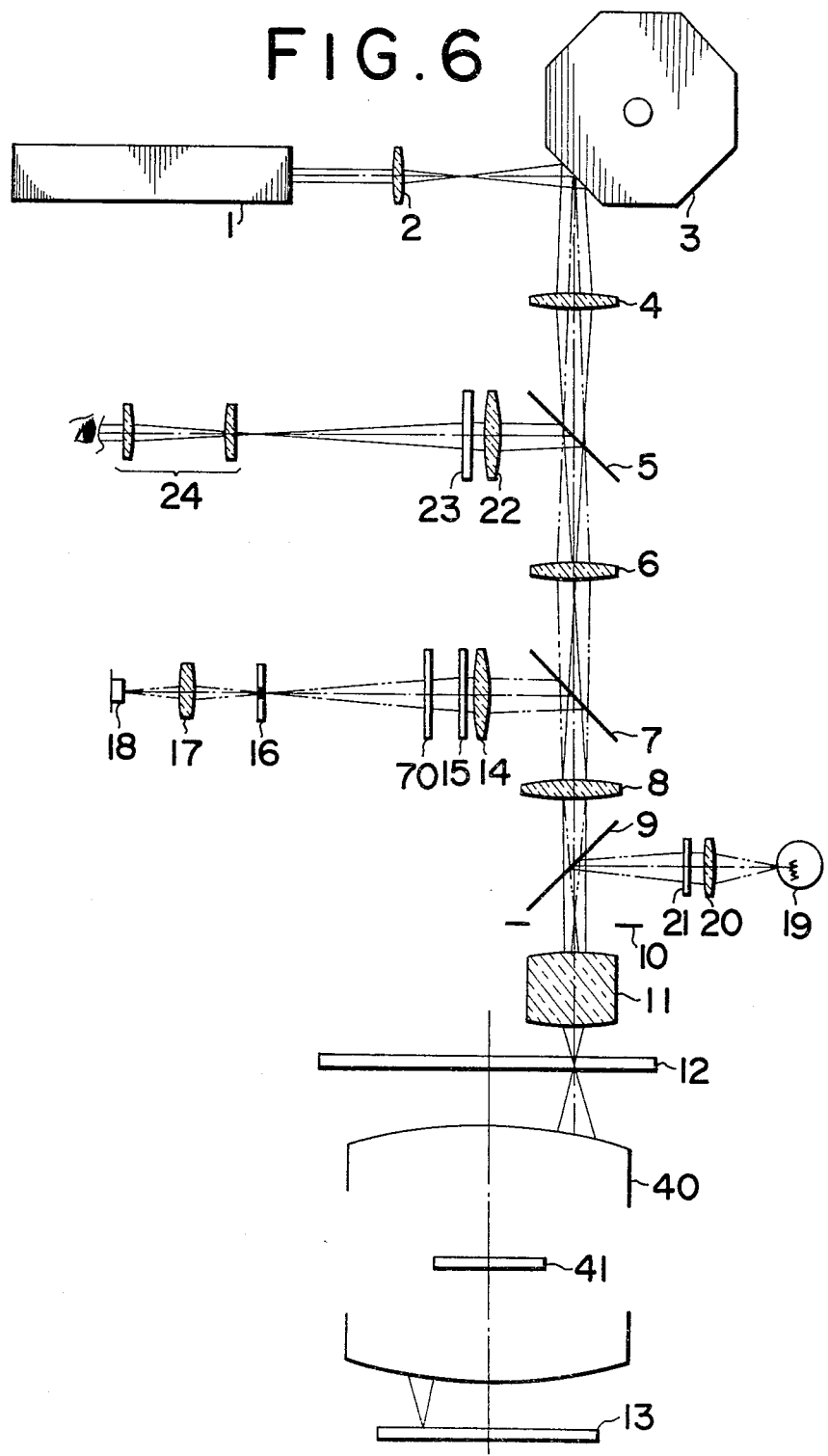
FIG. 6 shows a further embodiment of the present invention.

FIG. 6 shows an embodiment of the system in which only the light reflected from the wafer is simply directed to a photodetector 18. A polarizing plate 70 is disposed in the photoelectric detecting system so as to pass the reflected light from the wafer and cut off the light directly reflected from the mask. By intercepting the non-scattered light by the use of a douser 16, the desired mask and wafer signal can be detected. Operation of the system is almost identical to that of FIG. 1 and need not be described.

Figure 7:
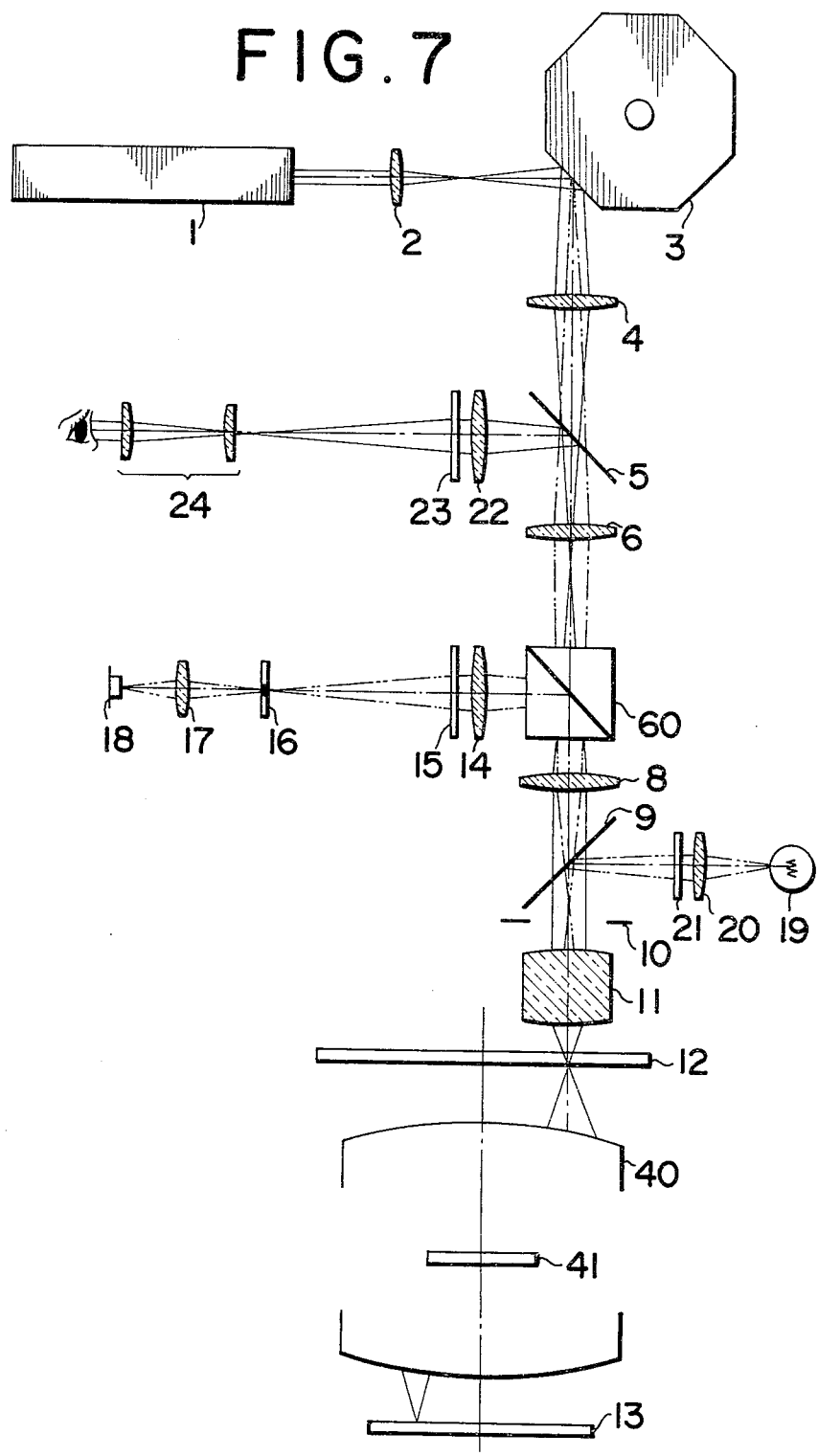
FIG. 7 shows still a further embodiment of the present invention.

FIG. 7 shows an embodiment in which a polarizing beam splitter 60 is used in the beam splitter portion of the scanning system and the photoelectric detecting optical system. This system has a very much pronounced characteristic, namely, an advantage that the loss of light is very small. For example, it is assumed that the beam splitter 60 passes therethrough a polarized component (P-component) which lies in the plane of the drawing sheet and reflects a polarized component (S-component) which is perpendicular to the plane of the drawing sheet. If the direction of polarization of the light from the laser when it first enters the beam splitter 60 is in the plane of the drawing sheet, namely, it is P-component, then the light intactly passes through the splitter 60 and scans over the mask 12 through the relay lens 8 and the objective lens 11. The light passing from the mask and through the image forming system 40 and reflected by the wafer back to the mask has its direction of polarization changed by 90° as compared with that when it has entered and thus, such light lies in a plane perpendicular to the plane of the drawing sheet. That is, it has become S-component. The light passed from the objective lens 11 and through the relay lens 8 to the polarizing beam splitter 60 is now S-component and therefore is reflected so as to be directed to the photoelectric detecting system 14 and so on. In contrast, the light directly reflected by the mask is not subjected to the action of the ¼ wavelength plate, and so its direction of polarization is invariable and even if it again enters the beam splitter 60, it passes therethrough toward the field lens 6 and does not enter the photoelectric detecting system. The reflection by the mask is only of the order of 4%, so that it may be considered that almost all of the light reaches the wafer and is reflected thereby, and it may be said that the efficiency of photoelectric detection of light is very high.

As has hitherto been described, photoelectric detection of non-scattered light can be effected very advantageously by a combination of polarization and a douser which cuts off non-scattered light. Also, the directly reflected light from the mask can be removed by the utilization of polarization and this leads to a merit that the interference of the reflected light from the wafer and the reflected light from the mask can be reduced. Thus, the present invention brings about a great effect in the photoelectric detection of this kind.

What we claim is:

1. A device for scanning with a light beam two objects each having a flat reflection surface and an inclined reflection surface inclined relative to the flat reflection surface comprising:

image forming optical means for imaging one of said objects on another object positioned between said two objects, a scanning optical system for scanning a surface of said objects by a light spot, said scanning optical system including a light source of linear polarized light, means for varying the polarized state of the light positioned between said two objects, photodetector means for detecting light reflected from one of said objects, filter means for intercepting light from the flat reflection surface, and for passing light from the inclined reflection surface to said photodetector, separating means for separating light passed through said varying means from unpassed light whereby said photodetector can receive only light passed through said varying means and reflected from said inclined surface.

2. A device according to claim 1, wherein said first source means is a laser.

* * * * *

UNITED STATES PATENT AND TRADEMARK OFFICE
CERTIFICATE OF CORRECTION

PATENT NO. : 4,251,129
DATED : February 17, 1981
INVENTOR(S) : AKIYOSHI SUZKI, et al.

It is certified that error appears in the above-identified patent and that said Letters Patent are hereby corrected as shown below:

Column 5, line 34, change "diagram" to --diaphragm--.

Column 8, line 41, change "first" to --light--.

Signed and Sealed this

Fifth Day of May 1981

[SEAL]

Attest:

RENE D. TEGTMEYER

Attesting Officer

Acting Commissioner of Patents and Trademarks